(12) United States Patent
Loeppert et al.

(10) Patent No.: US 8,987,030 B2
(45) Date of Patent: Mar. 24, 2015

(54) MEMS PACKAGE AND A METHOD FOR MANUFACTURING THE SAME

(75) Inventors: Peter V. Loeppert, Hoffman Estates, IL (US); Denise P. Czech, Schaumburg, IL (US); Lawrence A. Grunert, Lombard, IL (US); Kurt B. Friel, Sycamore, IL (US); Qing Wang, Bloomingdale, IL (US)

(73) Assignee: Knowles Electronics, LLC, Itasca, IL (US)

( * ) Notice: Subject to any disclaimer, the term of this patent is extended or adjusted under 35 U.S.C. 154(b) by 77 days.

(21) Appl. No.: 12/856,101

(22) Filed: Aug. 13, 2010

(65) Prior Publication Data

US 2011/0039372 A1 Feb. 17, 2011

Related U.S. Application Data

(60) Provisional application No. 61/233,589, filed on Aug. 13, 2009.

(51) Int. Cl.
 *H01L 29/10* (2006.01)
 *H01L 21/56* (2006.01)
 *B81B 7/00* (2006.01)

(52) U.S. Cl.
 CPC .............. *H01L 21/56* (2013.01); *B81B 7/0061* (2013.01); *B81B 2201/0257* (2013.01); *H01L 2924/0002* (2013.01)
 USPC ................. 438/51; 438/52; 438/68; 438/113; 257/E21.522; 257/E23.133

(58) Field of Classification Search
 USPC ............... 438/51, 52, 68, 113; 257/E21.522, 257/E23.133
 See application file for complete search history.

(56) References Cited

U.S. PATENT DOCUMENTS

| | | | |
|---|---|---|---|
| 6,117,705 A | 9/2000 | Glenn et al. | |
| 6,403,881 B1 | 6/2002 | Hughes | |
| 6,526,653 B1 | 3/2003 | Glenn et al. | |
| 6,594,369 B1 | 7/2003 | Une | |
| 6,707,168 B1 * | 3/2004 | Hoffman et al. | 257/796 |
| 6,914,367 B2 * | 7/2005 | Furukawa | 310/340 |
| 6,928,718 B2 | 8/2005 | Carpenter | |
| 7,381,589 B2 | 6/2008 | Minervini | |
| 7,388,281 B2 * | 6/2008 | Krueger et al. | 257/678 |
| 2001/0048156 A1 * | 12/2001 | Fukuizumi | 257/728 |
| 2002/0053724 A1 * | 5/2002 | Lai et al. | 257/679 |
| 2003/0109077 A1 * | 6/2003 | Kim et al. | 438/106 |
| 2007/0013036 A1 * | 1/2007 | Zhe et al. | 257/659 |
| 2007/0057602 A1 * | 3/2007 | Song | 310/328 |
| 2009/0001553 A1 | 1/2009 | Pahl et al. | |
| 2009/0146268 A1 * | 6/2009 | Huang et al. | 257/659 |
| 2009/0257614 A1 * | 10/2009 | Mei et al. | 381/355 |
| 2009/0298235 A1 * | 12/2009 | Kostiew et al. | 438/118 |
| 2010/0033268 A1 * | 2/2010 | Iizuka et al. | 333/187 |
| 2011/0115059 A1 * | 5/2011 | Lee et al. | 257/659 |

* cited by examiner

*Primary Examiner* — Su C Kim
(74) *Attorney, Agent, or Firm* — Lathrop & Gage LLP (57) ABSTRACT

A method is provided for manufacturing a plurality of packages. The method comprises the steps of: applying a means for adhering two or more covers to a substrate; positioning the two or more covers onto the substrate to create one or more channels bounded by the two or more covers and the substrate; coupling the covers to the substrate; depositing a material into the one or more channels; performing a process on the material to affix the material; and singulating along the channels to create the plurality of packages.

22 Claims, 8 Drawing Sheets

MEMS PACKAGE AND A METHOD FOR MANUFACTURING THE SAME

CROSS REFERENCE TO RELATED APPLICATION

This patent claims benefit under 35 U.S.C. §119 (e) to U.S. Provisional Application No. 61/233,589 entitled "MEMS Package and a Method for Manufacturing the Same" filed Aug. 13, 2009 the content of which is incorporated herein by reference in its entirety.

TECHNICAL FIELD

The present invention relates generally to a housing for a transducer. More particularly, this invention relates to a microphone package and a method for manufacturing the same.

BRIEF DESCRIPTION OF THE DRAWINGS

For a more complete understanding of the disclosure, reference should be made to the following detailed description and accompanying drawings wherein.

DETAILED DESCRIPTION

While the present disclosure is susceptible to various modifications and alternative forms, certain embodiments are shown by way of example in the drawings and these embodiments will be described in detail herein. It will be understood, however, that this disclosure is not intended to limit the invention to the particular forms described, but to the contrary, the invention is intended to cover all modifications, alternatives, and equivalents falling within the spirit and scope of the invention defined by the appended claims.

The present invention is a package for a microphone which utilizes an epoxy wall which surrounds a metal layer that forms a cover, or "can" as may be understood by one of ordinary skill in the art. The can and wall are attached to a base constructed from, for example, FR-4 material. This package may be part of a system for housing a transducer. The package may prevent radio frequency ("RF") interference and provide gasket-type functionality. It should be understood that the use of the term "epoxy" should not be construed to limit the present invention to the use of only epoxies. In actuality, other compounds may be used, such as other types of adhesive, solder, silicones, urethanes, conductive or non-conductive fillers, teflons, acrylics, and other polymers contemplated by those of skill in the art. The term "transducer" can be construed as pressure sensor, microphone, accelerometer, gyroscope, chemical sensor, or other property measurement devices.

In an embodiment, a method is provided for manufacturing a plurality of packages. The method comprises the steps of: applying a means for adhering two or more covers to a substrate; positioning the two or more covers onto the substrate to create one or more channels bounded by the two or more covers and the substrate; coupling the covers to the substrate; depositing a material into the one or more channels; performing a process on the material to affix the material; and singulating along the channels to create the plurality of packages.

In an embodiment, the means for adhering the covers to the substrate comprises one of an adhesive or solder.

In an embodiment, the covers are coupled mechanically.

In an embodiment, the covers are electrically coupled.

In an embodiment, the covers are coupled to the substrate by a curing process.

In an embodiment, the covers are coupled to the substrate by a reflow process.

In an embodiment, the material is a self-leveling fluid.

In an embodiment, the process is one of heating, exposure to light, use of a catalyst, and use of moisture.

In an embodiment, the material comprises one of a powder, paste and gel.

In an embodiment, the process self-levels and solidifies the material.

In an embodiment, the singulation is performed by a process selected from the group consisting of: dicing, punching, routing, sawing, and scribing and breaking.

In an embodiment, the covers are positioned using a technique selected from the group consisting of: individual pick-and-place, gang pick-and-place, and palletizing and flipping.

In an embodiment, depositing the material is performed using a technique selected from the group consisting of: dispensing, jetting, pouring, printing, overfilling and scraping excess, spraying, and transfer stamping.

In an embodiment, a method is provided for manufacturing a plurality of packages. The method comprises the steps of: positioning two or more covers onto a substrate to create one or more channels bounded by the two or more covers and the substrate; depositing a material into the one or more channels; performing a process on the material to affix the material wherein the affixation couples the covers to the substrate; and singulating along the channels to create the plurality of packages.

In an embodiment, the covers are coupled mechanically.

In an embodiment, the covers are electrically coupled.

In an embodiment, the process is one of heating, exposure to light, use of a catalyst, and use of moisture.

In an embodiment, the material comprises one of a powder, paste and gel.

In an embodiment, the singulation is performed by a process selected from the group consisting of: dicing, punching, routing, sawing, and scribing and breaking.

In an embodiment, the covers are positioned using a technique selected from the group consisting of: individual pick-and-place, gang pick-and-place, and palletizing and flipping.

Figure 1:
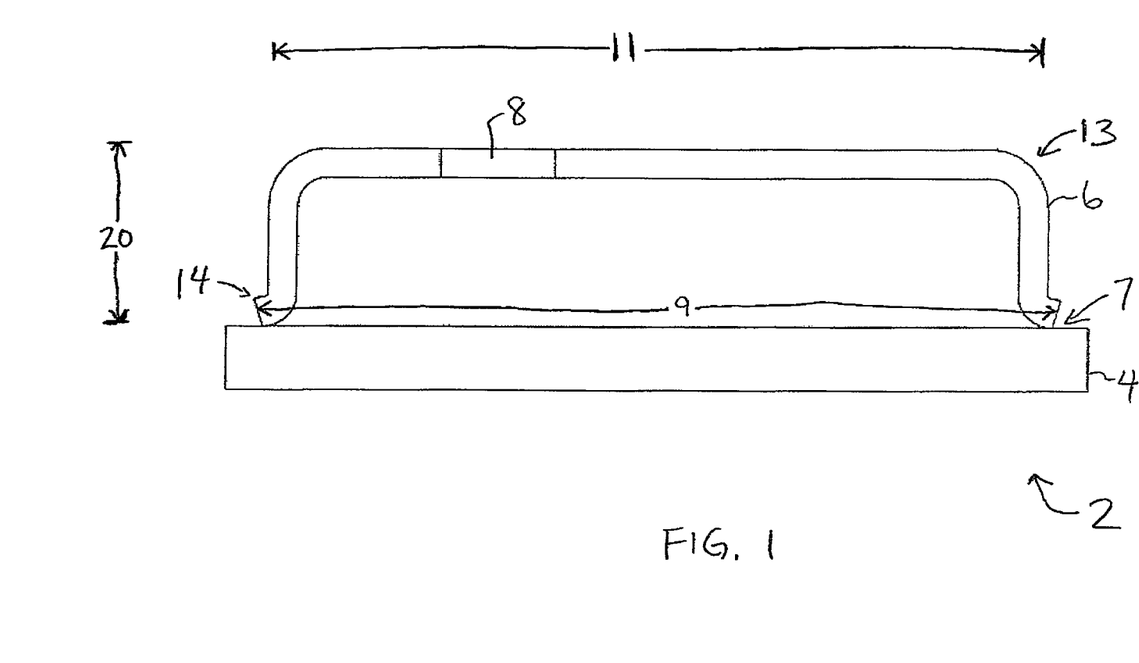
FIG. 1 is a side cross-sectional view of a metal can and base of a package in an embodiment of the present invention.
Figure 2:
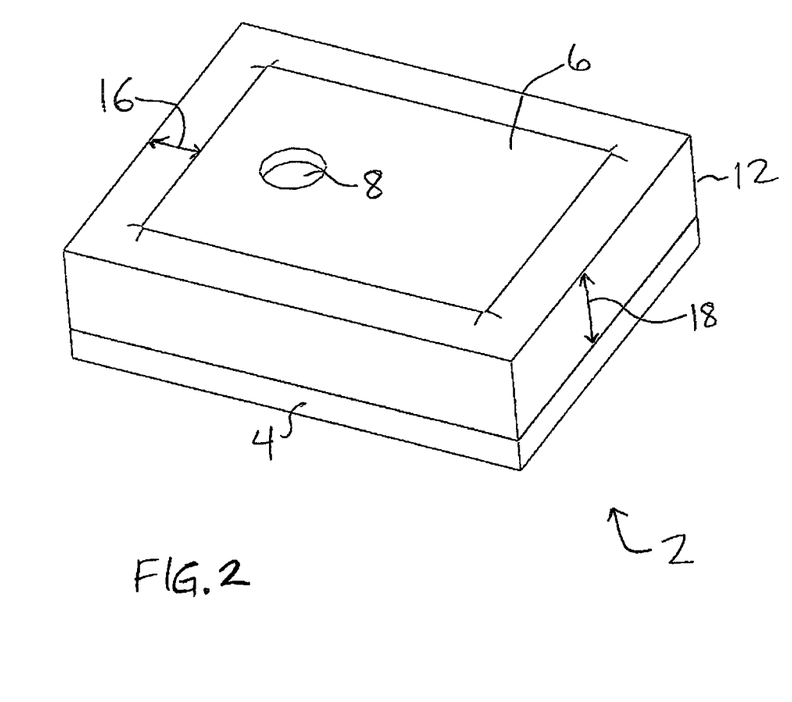
FIG. 2 is a perspective of the package of FIG. 1 including an epoxy wall surrounding the metal can in an embodiment of the present invention.

Now, referring to FIGS. 1-2, a cover and base layer, or substrate, of a package 2 is illustrated. The base layer 4 may be a printed circuit board layer. An example of material used to construct this layer may be FR-4 material. Other materials are also contemplated. The cover 6, or "can" may be attached to the base layer 4. The attachment may be facilitated via adhesives and/or soldering and/or any other methods contemplated by those of skill in the art. The cover 6 may be constructed from Aluminum, Brass, Nickel (metals in general), Plastics, Ceramics, Semiconductors and composites of all mentioned previously. The cover 6 is attached for protection and processibility. The cover 6 optionally contains an aperture 8 which itself may incorporate a barrier to prevent water, particles and/or light from entering the package and damaging the internal components inside (not shown); i.e. semiconductor chips. The aperture 8 is adapted for allowing sound waves to reach a transducer. The cover 6 may have a substantially square, or otherwise rectangular, shape with somewhat rounded corners 14. The cover 6 may attach to the base layer 4 at a lower end 7. A perimeter 9 at the lower end 7 may be greater than a perimeter 11 at an upper end 13 of the cover 6.

An epoxy wall or boundary 12 may surround the cover 6. Examples of epoxies which may be utilized are Epotek H70E series, Ablebond 2035SC, or the like. In an embodiment, the epoxy wall 12 may have a thickness 16 in a range from 0.025 mm to 0.5 mm. In an embodiment, the epoxy wall 12 may have a height 18 which, in relative terms, is less than a height 20 of the metal cover 6. Both the cover 6 and the epoxy wall 12 are positioned on the base layer 4. By surrounding the cover 6, the epoxy wall 12 may provide a gasket-type functionality (i.e., may prevent leakage of gases, materials, etc., into or out of the cover 6). In an embodiment, the compound that is dispensed or otherwise applied is a self-leveling compound, in a fluid, paste or other form. In another embodiment the compound may be leveled during a post processing step such as curing or re-flowing.

Figure 3:
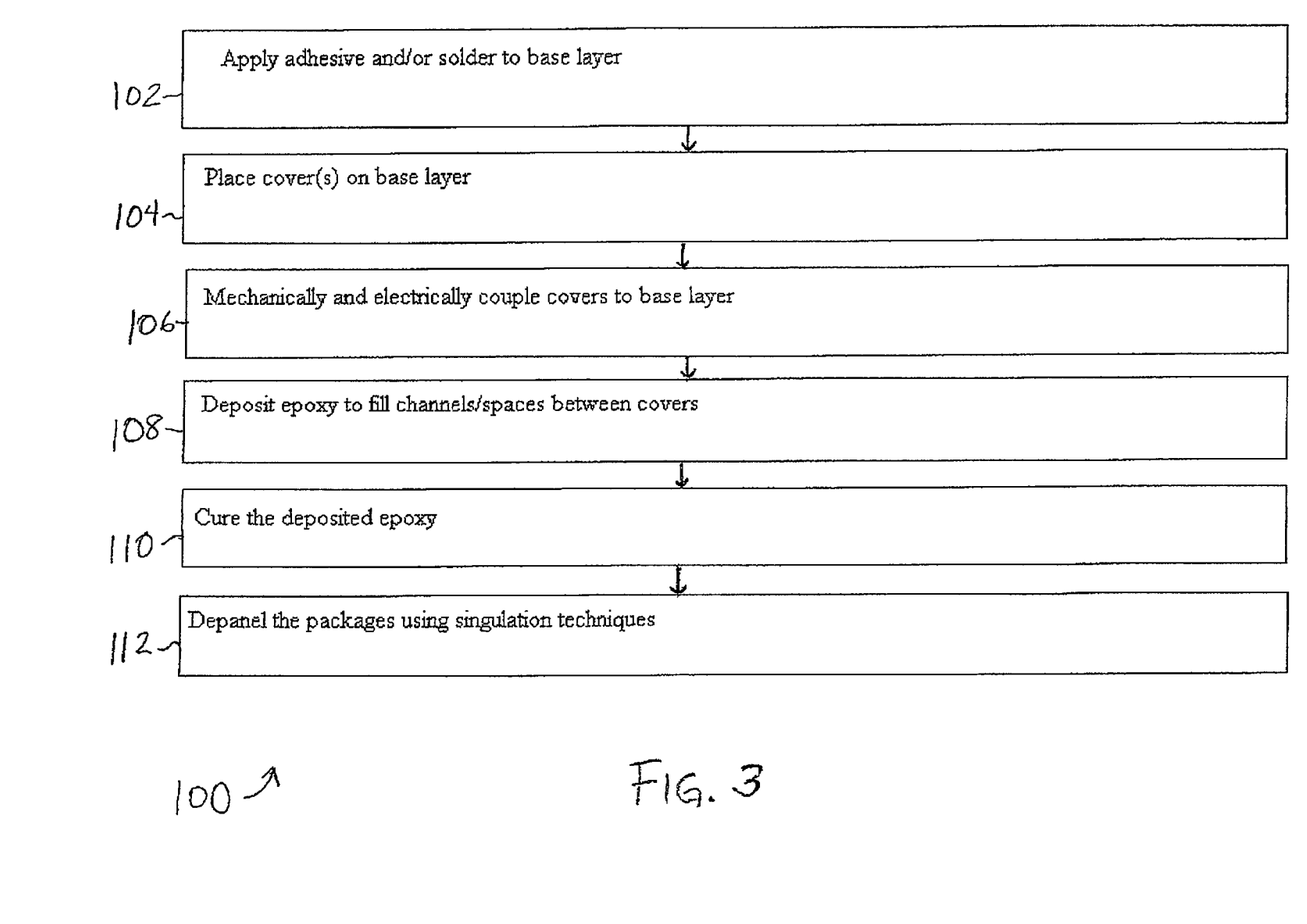
FIG. 3 is a method for manufacturing a package in an embodiment of the present invention.
Figure 4:
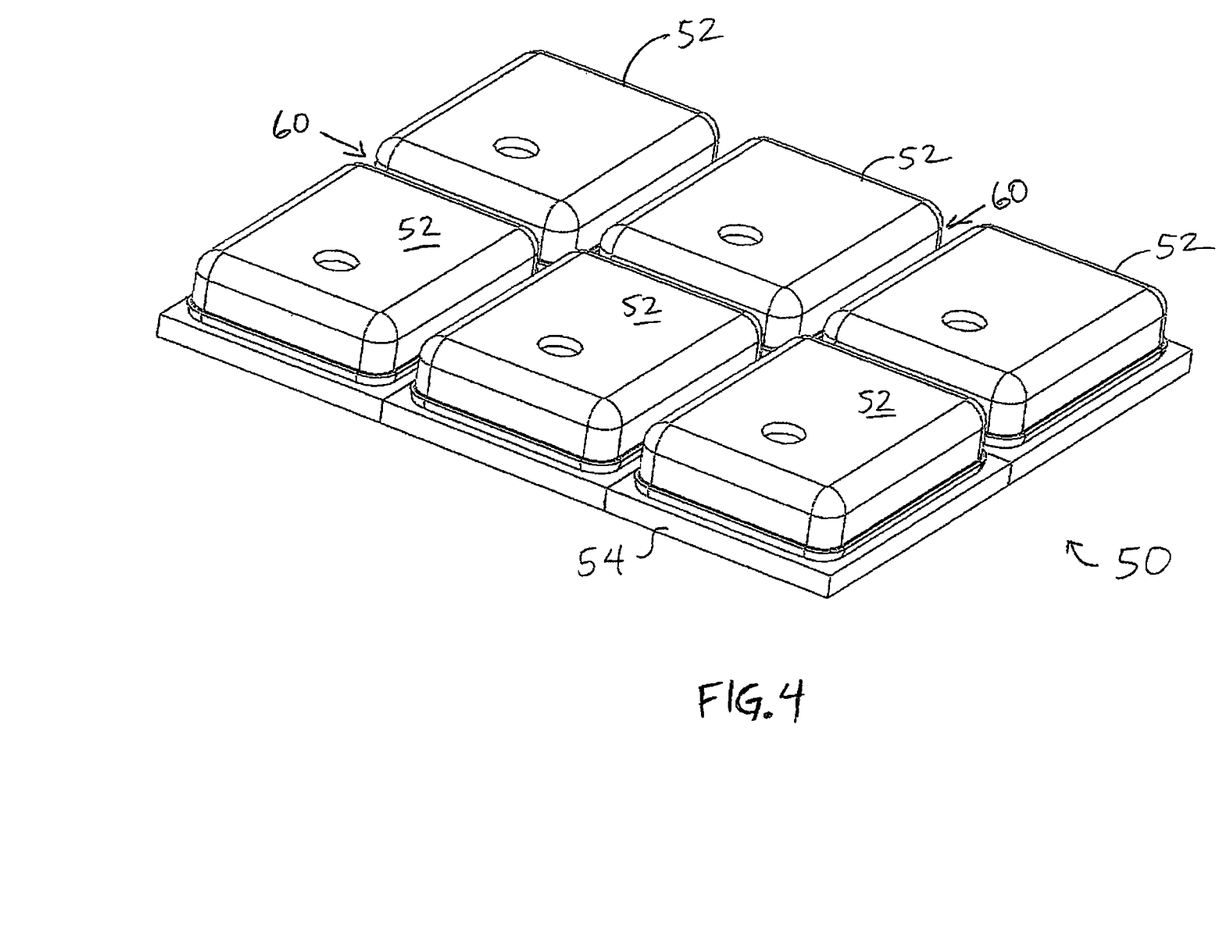
FIG. 4 is a perspective view of an array of microphone packages in an embodiment of the present invention.
Figure 5:
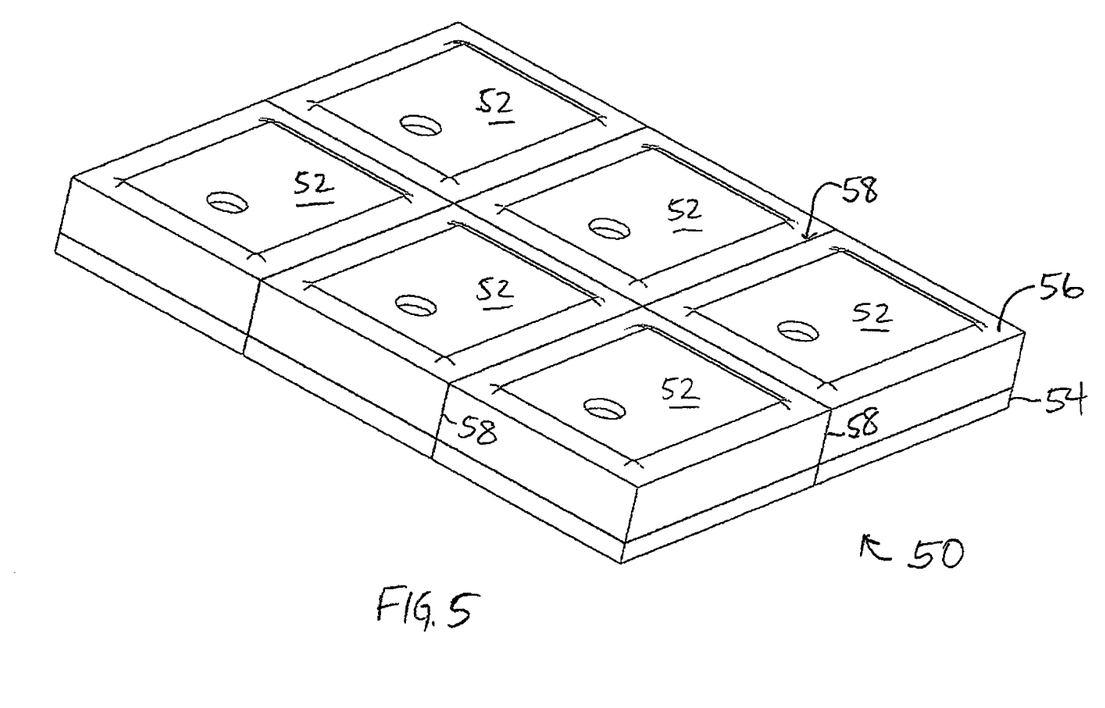
FIG. 5 is a perspective view of the array of FIG. 4 with an epoxy layer deposited thereupon.

Referring to FIGS. 3-5, a process is illustrated for manufacturing the package 2 described above. FIG. 3 illustrates a method 100 for creating an individual package from an array of covers which have been deposited on a layer of FR-4 material.

Figure 7:
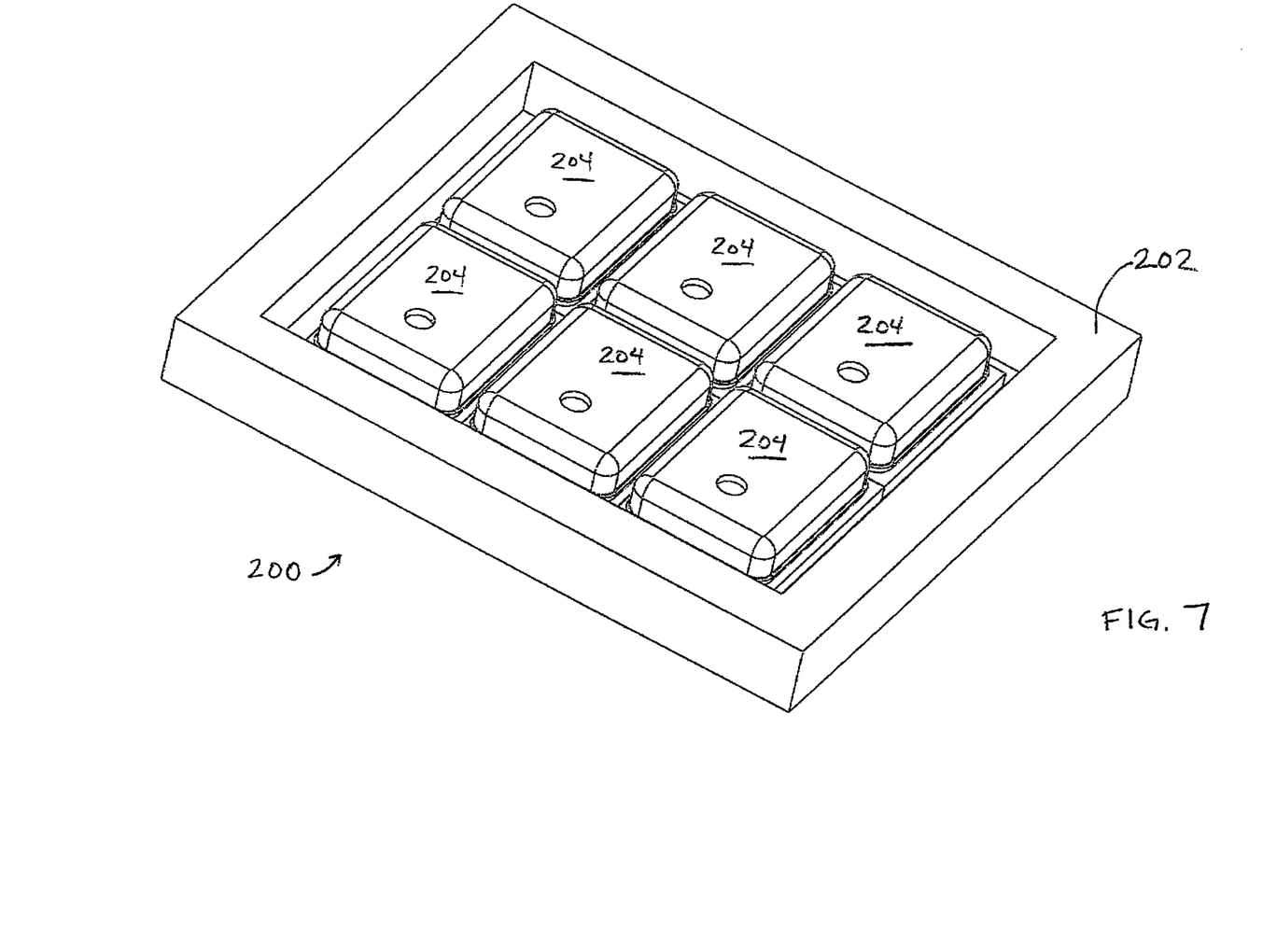
FIG. 7 is a perspective view of an array of packages surrounded by a dam.
Figure 8:
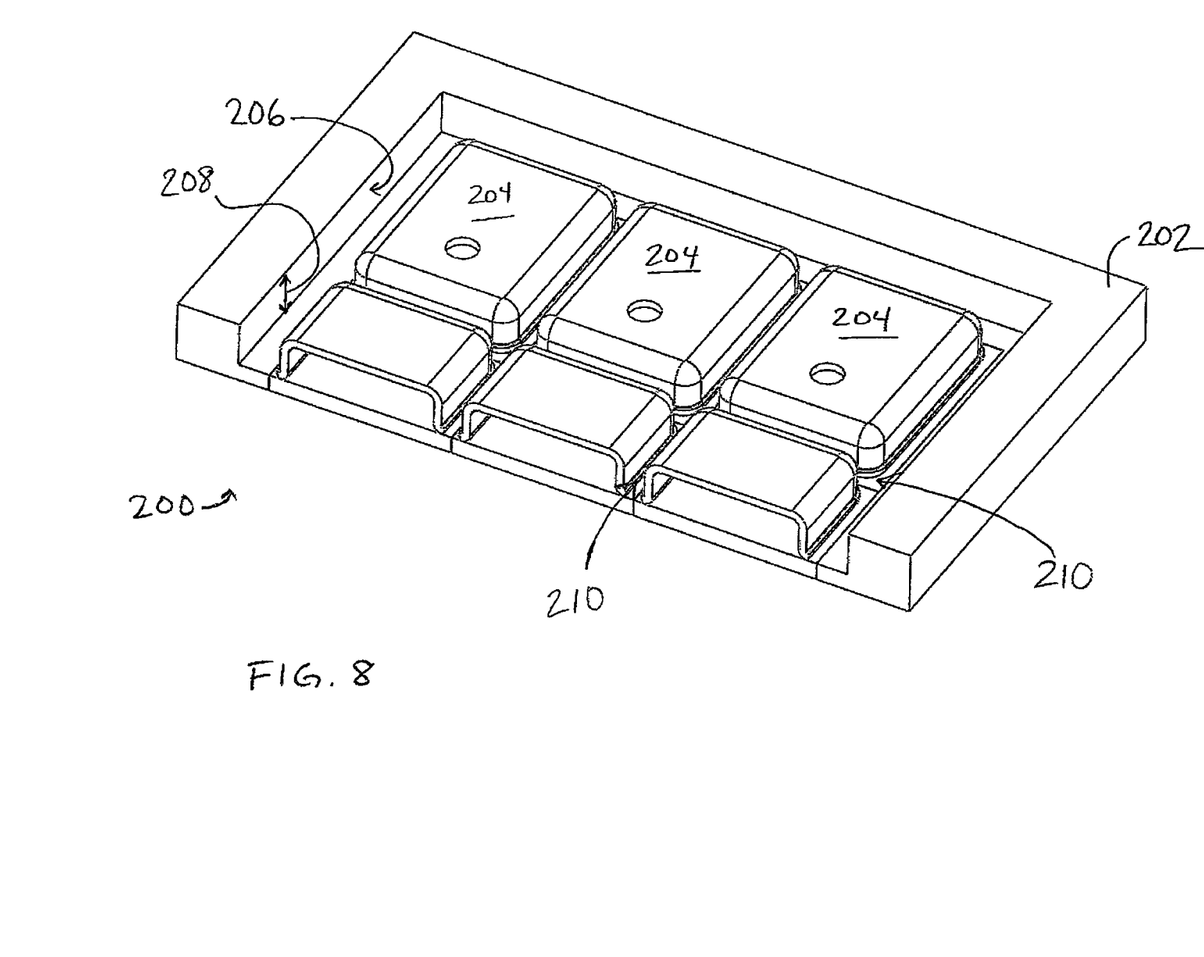
FIG. 8 is a cross-sectional view of the array of FIG. 7.

In a first step 102, adhesive and/or solder is applied to the PCB layer. In a second step 104, one or more metal covers are positioned onto the PCB layer. These covers may be added by, for example, individual pick-and-place, gang pick-and-place, palletizing and flipping. In a third step 106, the metal cans or covers are mechanically and electrically coupled to the PCB layer, via for example, a curing or reflow process (which can occur before or after step 108, depending on the embodiment). The array of metal covers (described below) creates channels or "streets" between the rows of covers. In a fourth step 108, epoxy is deposited onto the PCB layer to fill in these channels, streets, or cavities. In an embodiment, illustrated in FIGS. 7 and 8, a dam 202 may be provided which surrounds an array 200 of packages 204, and adhesive may be poured or otherwise dispensed to surround the packages 204 but be bounded by the dam 202. The dam 202 may have a shape which is rectangular; however, other shapes are contemplated as necessary for a given application. Walls 206 of the dam 202 may have a height 208 sufficient to allow the epoxy (not shown) to level or be leveled at a height necessary to surround the package 204 and provide a sufficient seal against the packages 204. The walls 206 may serve to terminate channels 210. The dam 202 may be constructed from metal, plastic, rubber, or other material appropriate for a given application. In a fifth step 110, the epoxy is cured. In a sixth step 112, the individual packages are de-paneled using singulation techniques, such as, for example, the use of a wafer saw, or other method contemplated by those of skill in the art.

Figure 6:
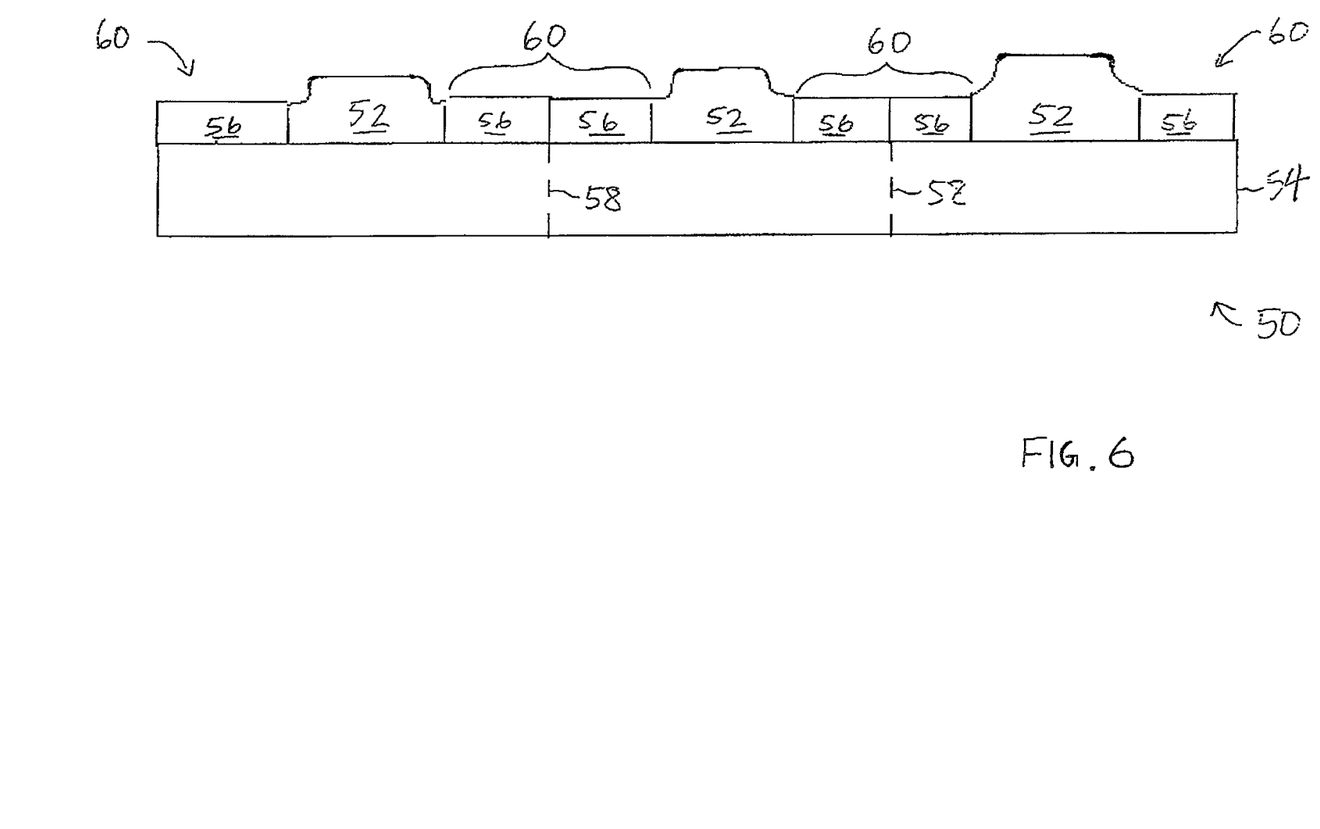
FIG. 6 is an isolated side cross-sectional view of an array of microphone packages having a layer of epoxy deposited thereupon.

An example of an array 50 is provided in FIG. 4 in a perspective view. The array 50 has several covers 52 which are attached to a layer 54 of printed circuit board. FIG. 5 illustrates the layer 54 having an epoxy layer 56 deposited thereupon to fill the channels 60 and/or form the epoxy wall. An isolated side view, in FIG. 6, shows that enough epoxy 56 is deposited within channels 60 between each of the rows of covers 52 that a wall, or boundary, is formed around the perimeter of the cover 52. Once singulation has been performed on the array 50, along, for example, lines 58, in addition to substantially perpendicular lines (not shown, but contemplated by those of skill in the art), the individual packages (an example of which is provided in FIG. 2) can be attached to a layer of printed circuit board as part of a package for housing a transducer.

It will be appreciated that numerous variations to the above-mentioned approaches are possible. Variations to the above approaches may, for example, include performing the above steps in a different order.

All references, including publications, patent applications, and patents, cited herein are hereby incorporated by reference to the same extend as if each reference were individually and specifically indicated to be incorporated by reference and were set forth in its entirety herein.

Preferred embodiments of this invention are described herein, including the best mode known to the inventors for carrying out the invention. It should be understood that the illustrated embodiments are exemplary only, and should not be taken as limiting the scope of the invention.

We claim:

1. A method of manufacturing a plurality of MEMS transducer packages, the method comprising the steps of:
  applying a first material for coupling two or more discrete covers to a substrate;
  positioning the two or more covers onto the substrate to create one or more channels bounded by the two or more covers and the substrate, each of the two or more covers comprising four side portions and a top portion forming an interior region between each cover and the substrate, such that the side portions of each cover form a physical barrier between each interior region and the channels;
  coupling the covers to the substrate;
  depositing a second material onto the substrate in the one or more channels;
  performing a process on the second material to affix the second material; and
  singulating along the channels to create the plurality of MEMS transducer packages.

2. The method of claim 1 wherein the first material comprises one of an adhesive or solder.

3. The method of claim 1 wherein the covers are coupled mechanically.

4. The method of claim 1 wherein the covers are electrically coupled.

5. The method of claim 1 wherein the covers are coupled to the substrate by a curing process.

6. The method of claim 1 wherein the covers are coupled to the substrate by a reflow process.

7. The method of claim 1 wherein the second material is a self-leveling fluid.

8. The method of claim 1 wherein the process is one of heating, exposure to light, use of a catalyst, and use of moisture.

9. The method of claim 1 wherein the second material comprises one of a powder, paste and gel.

10. The method of claim 1 wherein the process self-levels and solidifies the second material.

11. The method of claim 1 wherein the singulation is performed by a process selected from the group consisting of: dicing, punching, routing, sawing, and scribing and breaking.

12. The method of claim 1 wherein the covers are positioned using a technique selected from the group consisting of: individual pick-and-place, gang pick-and-place, and palletizing and flipping.

13. The method of claim 1 wherein depositing the second material is performed using a technique selected from the group consisting of: dispensing, jetting, pouring, printing, overfilling and scraping excess, spraying, and transfer stamping.

14. A method of manufacturing a plurality of MEMS transducer packages, the method comprising the steps of:
positioning two or more discrete covers onto a substrate to create one or more channels bounded by the two or more covers and the substrate, each of the two or more covers comprising four side portions and a top portion forming an interior region between each cover and the substrate, such that the side portions of each cover form a physical barrier between each interior region and the channels;
depositing a material onto the substrate in the one or more channels;
performing a process on the material to affix the material wherein the affixation couples the covers to the substrate; and
singulating along the channels to create the plurality of MEMS transducer packages.

15. The method of claim 14 wherein the covers are coupled mechanically.

16. The method of claim 14 wherein the covers are electrically coupled.

17. The method of claim 14 wherein the process is one of heating, exposure to light, use of a catalyst, and use of moisture.

18. The method of claim 14 wherein the material comprises one of a powder, paste and gel.

19. The method of claim 14 wherein the singulation is performed by a process selected from the group consisting of: dicing, punching, routing, sawing, and scribing and breaking.

20. The method of claim 14 wherein the covers are positioned using a technique selected from the group consisting of: individual pick-and-place, gang pick-and-place, and palletizing and flipping.

21. The method of claim 1 where each of the two or more covers further comprises an acoustic port in the top portion.

22. The method of claim 14 where each of the two or more covers further comprises an acoustic port in the top portion.

* * * * *